United States Patent [19]
Kosugi

[11] Patent Number: 5,396,433
[45] Date of Patent: Mar. 7, 1995

[54] APPARATUS AND METHOD FOR ASSEMBLING AND CHECKING MICROWAVE MONOLITHIC INTEGRATED CIRCUIT (MMIC) MODULE

[75] Inventor: Yuhei Kosugi, Tokyo, Japan
[73] Assignee: NEC Corporation, Tokyo, Japan
[21] Appl. No.: 224,660
[22] Filed: Apr. 7, 1994
[30] Foreign Application Priority Data Apr. 7, 1993 [JP] Japan .................... 5-105014

[51] Int. Cl.[6] .............................. G06F 15/46
[52] U.S. Cl. .................. 364/468; 364/490; 364/554
[58] Field of Search ............ 364/468, 488, 489, 490, 364/491, 578, 164, 165, 554, 552

[56] References Cited

U.S. PATENT DOCUMENTS

| | | | |
|---|---|---|---|
| 4,901,242 | 2/1990 | Kotan | 364/468 |
| 5,031,111 | 7/1991 | Chao et al. | 364/490 X |
| 5,047,947 | 9/1991 | Stump | 364/468 |

Primary Examiner—Joseph Ruggiero
Attorney, Agent, or Firm—Sughrue, Mion, Zinn, Macpeak & Seas

[57] ABSTRACT

Assembling and checking microwave circuit modules is accomplished by storing results of checks of active elements after the manufacture, determining a combination of active elements according to the stored results or data, calculating the characteristic value of the determined combination according to the results of checks of the active elements in the combination, computing, if the calculated characteristic value is out of a predetermined range, a content and an amount of adjustment to be made in a substrate so as to correct the characteristic value to be in the predetermined range, and adjusting the substrate according to the result of computation. By selecting an appropriate combination, the chips whose characteristic value falls outside of the predetermined range are saved from being discarded, so that a low cost microwave circuit module can be obtained at a high overall yield.

6 Claims, 7 Drawing Sheets

FREQUENCY DISTRIBUTION

APPARATUS AND METHOD FOR ASSEMBLING AND CHECKING MICROWAVE MONOLITHIC INTEGRATED CIRCUIT (MMIC) MODULE

BACKGROUND OF THE INVENTION

1. Field of the Invention

This invention relates to an apparatus and a method for manufacturing a microwave circuit module, and more particularly to a method of assembling and checking microwave circuit modules which are used for microwave communication systems and the like.

An MMIC (microwave monolithic integrated circuit) is now in the stage of practical utilization. An ultra-high frequency integrated circuit is greatly different from the general digital IC in that it cannot be realized only with lumped parameter circuits but requires distributed constant circuits.

However, the above integrated circuit is not suited for integrating therein distributed constant circuits in a large scale. The distributed constant circuit has a size determined by the wavelength, and it usually requires a great space for installation or mounting.

The increased size in the MMIC is disadvantageous from the points that gallium arsenide (GaAs) is often utilized, that thin wafers are preferred in view of characteristic requirements, and that the price becomes high. In these respects, the MMIC is not suited for the large-scale integration.

As means for solving the above problems and economically realizing large-scale microwave circuits including distributed constant circuit elements, the inventor has proposed "Composite Microwave Circuit Module" (Japanese Patent Application No. Hei 4(1992)—291031 which was filed in Japan on Oct. 29, 1992 and which has not been published yet).

FIG. 10 shows the composite microwave circuit module disclosed in the patent application referred to above. As shown therein, a dielectric substrate which is formed as a lamination of multiple layers is provided with ground surfaces formed of conductive layers comprised of an upper and a lower layer 26 and 23, and signal circuits 24 and 25 formed of one or more conductive layers for signal transmission and disposed in an intermediate layer portion of the substrates.

Further, in this composite microwave circuit module, a shield surrounding the signal circuits 24 and 25 is formed by thorough-holes 32 and 84 which are formed around the signal circuits 24 and 25 for short-circuiting the two ground surfaces. These circuits include active elements 28, such as MMICs, ICs, transistors, diodes, etc., and passive elements, which are formed by patterning of strip lines, microstrip lines, coplanar lines, etc. these elements being electrically connected to one another to obtain an integrated structure.

Referring to FIG. 10, designated at 20 is a base plate, at 21 a layered capacitor, at 22 a conductive cap, at 27 a wiring or interconnect layer, at 29 a signal line pattern, at 30 a power source pattern, at 31 a bonding wire, at 33 a chip installation land, at 35 a conductor pattern, and at 36 a land.

In the above composite microwave circuit module, the active elements and the divided connection substrate for interconnecting these elements are realized by use of interconnect patterns within the integrated multilayer substrate, whereby the characteristic deterioration caused by connection is precluded and the number of process steps in the fabrication is reduced.

Further, in the above composite microwave circuit module, the interference due to coupling of the microwave circuits that results from the accommodation of the circuits in a common case and the resonance that results from the case as a cavity are avoided by the provision of a shield structure or a cavity structure accommodating active elements.

Also, in the above composite microwave circuit module, integration inclusive of peripheral circuits makes a reduction in a large number of mounting stage layers which have heretofore been necessary, thus attaining the reduction of the size and cost. This composite microwave circuit module is complementary to the MMIC techniques which are otherwise not suited for the assembling of passive elements for large-scale integration including passive elements and lines.

In realizing the above cavity structure, a dielectric portion above the intermediate layer portion used for signal transmission is removed thereby forming a cavity as a place to install such semiconductor elements as MMICs. The semiconductor elements are installed thereat and the ground surface removed at the top is covered with a conductive cap.

Further, the above seal structure of the composite microwave circuit module realizes an air-tight seal with the conductive cap and provides a protective structure with the conductive cap, whereby the semiconductor elements installed are protected from contamination by external fields.

The above composite microwave circuit module has the following other features.

Firstly, the composite microwave circuit module is with a structure, in which a conductor land (an element installation surface) is provided in the intermediate layer portion and connected to a lower layer ground surface via a plurality of via-holes (for the reduction of RF impedance), and the via-holes are filled with a metal to reduce thermal resistance with respect to the lower layer and to obtain effective heat conduction.

Secondly, the composite microwave circuit module is with a structure, in which the via-holes are provided right underneath a local heat generation spot such as a transistor region in a semiconductor chip for thermal resistance reduction.

Thirdly, the composite microwave circuit module is with a structure, in which a plurality of conductor layer lands are provided as alternate capacitor and ground lands between an element-installation surface of the intermediate layer portion and a lower ground layer, with the capacitor lands connected together and the ground surface and the ground lands connected together via via-holes, thus forming a laminate capacitor which functions as a bypass capacitor for an installed element (mounted chip), while dissipating heat laterally through the laminated conductor layer lands to reduce the thermal resistance.

In the fourth place, the composite microwave circuit module is with a structure, in which the intermediate layer portion is provided with a very thin dielectric layer which forms, together with the conductor patterns on both sides of such dielectric layer, capacitive coupling, thus forming a transmission line to cut direct current (DC) component.

In the fifth place, the composite microwave circuit is with a structure, in which a dielectric layer is formed on an upper ground layer with conductor patterns formed thereon as wiring patterns to obtain power supply wirings.

In the sixth place, the composite microwave circuit module is with a structure, in which, at a portion connected to inner layers, a land is provided to form together with the immediate vicinity ground layer a capacitor as a bypass capacitor to prevent RF leakage from the inner layers.

The above composite microwave circuit module is manufactured with a technique which permits realizing a large-scale microwave circuit in a compact form. However, it includes a plurality of active elements and these active elements are subject to characteristic fluctuations in manufacture. Therefore, an improvement is called for in this area in order to enhance the yield of the overall manufacturing of the composite microwave modules.

As an example, where it is desired to obtain an overall yield of 90% or above of the circuit module which includes a total of five active elements, such as amplifier, oscillator, mixer, etc., and if the yield is simply distributed to the five active elements, each element should be given a yield of 98% or above. If the yield is also distributed to the assembling process, the yield for each element is even higher.

The characteristic fluctuations are inevitable in the active elements, and the reason therefor is that they are ultra-high frequency integrated circuits using gallium arsenide and are also analog circuits.

Therefore, it is unfeasible to require an yield of 98% on standards inclusive of those of the characteristic fluctuations of the active elements. Such a requirement would result in a low proportion of active elements as units falling within the rated fluctuation standards. If it is desired to obtain a composite microwave circuit module with an economically high yield, therefore, a special measure has to be considered.

A generally conceivable method to this end is to check electrical characteristics of the composite microwave circuit module after the installation of the active elements and adjust microstrip lines around the active elements according to the check results, thereby obtaining a desired performance.

This method, however, has a problem in that it is difficult to carry out the adjustment after completion of the assemblage of the module constituting a large-scale circuit. Another problem is that the active elements are apt to be contaminated so that, since they cannot be given any seal before completion of the adjustments, the reliability thereof is lowered.

Further, the adjustment of microstrip lines around the active elements requires a high skill and a long time, thus leading to a high price.

SUMMARY OF THE INVENTION

It is, therefore, an object of the invention to provide an improved method and an apparatus for manufacturing a microwave circuit module which overcomes the problems explained above.

It is another object of the invention to manufacture a highly reliable microwave circuit module at a low cost and with a high overall yield.

According to one aspect of the invention, there is provided an apparatus for manufacturing a microwave circuit module having a plurality of active elements mounted on a substrate, the apparatus comprising:

a memory means which stores results of checks of characteristics of the active elements immediately after the manufacture with the results being stored individually in correspondence to the active elements;

a combination determining means which determines a combination among the active elements such that a characteristic value to be derived from the combination among the active elements based on the results in the memory means is in a predetermined range;

a calculating means which calculates a combined predicted characteristic value of the combination based on the results in the memory means on each of those active elements which are determined by the combination determining means;

a computing means which, when the combined predicted characteristic value obtained at the calculating means is outside the predetermined range, computes a content and an amount of adjustment to be made in the substrate for the combined predicted characteristic value to be in the predetermined range;

a substrate processing means which processes the substrate based on results of computation in the computing means; and an assembling means which assembles the active elements in the combination determined by the combination determining means on the substrate having been processed in the substrate processing means.

According to the invention, it is possible to obtain a low cost and highly reliability microwave circuit module at a high overall yield, which is accomplished by storing the results of checks of the respective active elements after the manufacture in correspondence to the individual active elements, determining a combination of active elements according to the stored results or data, calculating the characteristic value of the determined combination according to the results of checks of the active elements in the combination, computing, if the calculated characteristic value is out of a predetermined tolerable range, a content and an amount of adjustment to be made in the combined characteristic value for such value to be in the predetermined tolerable range, and adjusting the substrate according to the result of computation,

BRIEF DESCRIPTION OF THE DRAWINGS

The above and other objects, features and advantages of the present invention will be apparent from the following description of preferred embodiments of the invention explained with reference to the accompanying drawings, in which:

FIGS. 8A–8C are diagrams for explaining other examples by which the adjustment is made in substrate, FIG. 6A showing a method of adjustment by wire bonding, FIG. 6B showing a method of adjustment by cutting or removing a microstrip line portion by evaporation caused by exposure to a laser beam, and FIG. 6C showing a method of adjustment by bonding a ferroelectric piece;

PREFERRED EMBODIMENTS OF THE INVENTION

Now, preferred embodiments according to the invention are explained hereunder with reference to the drawings.

Throughout the following explanation, similar reference symbols or numerals refer to the same or similar elements in all the figures of the drawings.

Figure 1:
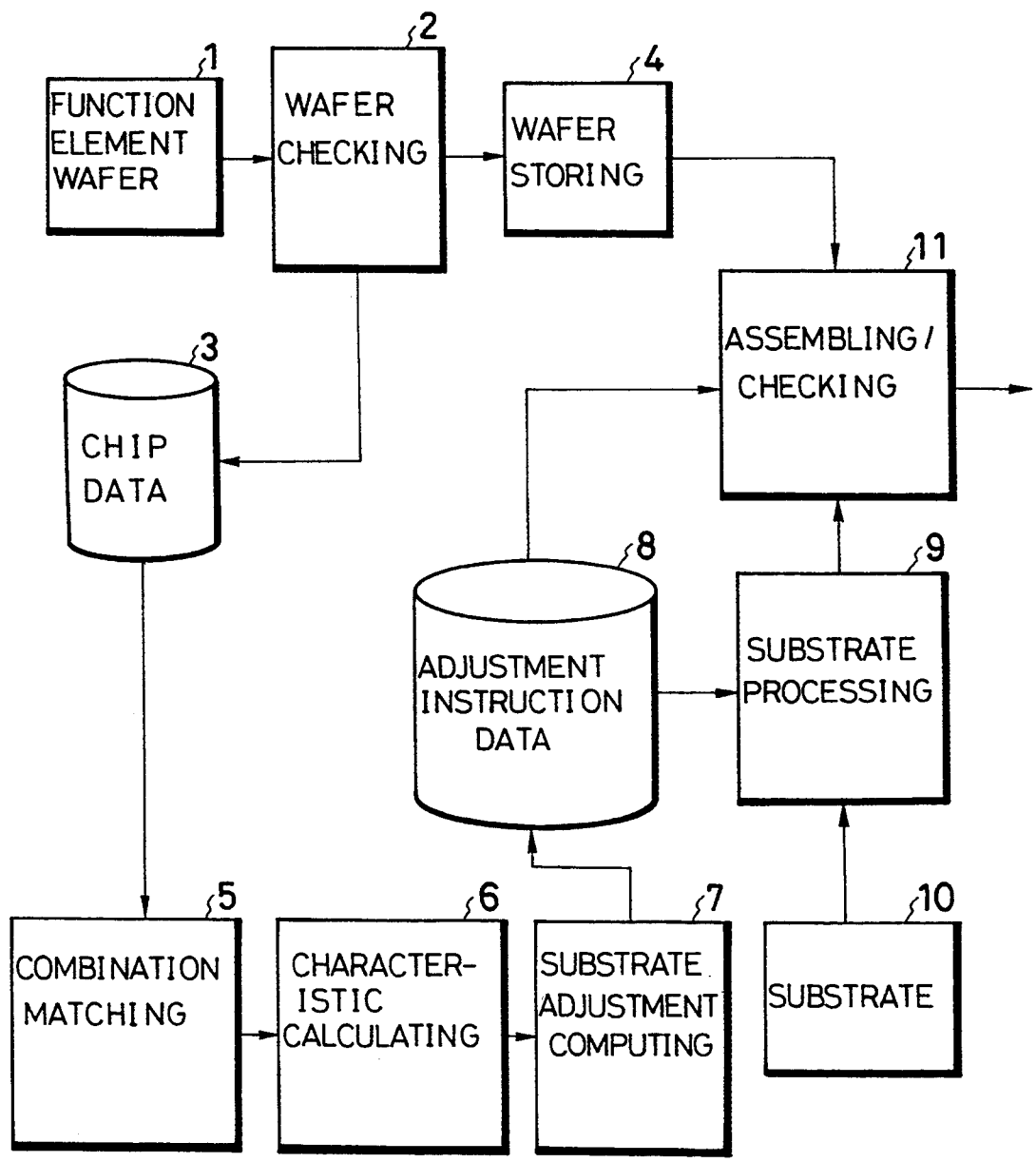
FIG. 1 is a block diagram showing a general structural arrangement of an embodiment of the invention.

Referring to FIG. 1 which shows in a block diagram an arrangement in an embodiment of the invention, a wafer checking unit 2 checks all the active elements on a function element wafer 1 and makes selection in them. The results are stored in a function element wafer storage unit 4. Also, the checked results (i.e., characteristic data of the checked active elements) are stored in a chip data unit 3.

A ship combination matching unit 5 determines an optimum combination of a plurality of active elements according to the data in the chip data unit 3 such that a desired characteristic can be approached by a combination of a plurality of selected and identified active elements.

A characteristic calculating unit 8 calculates a predicted characteristic, which is obtainable when the plurality of active elements in the combination determined by the chip combination matching unit 5 are assembled as a microwave circuit module.

A substrate adjustment amount computing unit 7 calculates the amount of adjustment of the microwave circuit module substrate, if it is determined that the characteristic calculated in the characteristic calculating unit 6 is outside a desired standard range. More specifically, the unit 7 determines through simulation a process which is to be added to an adjustable portion prepared in a particular portion of the microwave circuit module substrate in order to obtain a module characteristic that is in the desired standard range. The result of simulation is stored as adjustment process instruction data in an adjustment process instruction data unit 8.

A substrate adjustment processing unit 9 executes an adjustment processing, as analog circuit tuning with respect to the substrate 10, according to the data stored in the adjustment processing instruction data unit 8, and feeds the adjusted substrate to an assembling/checking unit 11.

The assembling/checking unit 11 assembles a microwave circuit module by installing the plurality of active elements in the combination, which has been determined by the chip combination matching unit 5, on the substrate having been adjusted in the substrate adjustment processing unit 9. The unit 11 also checks the assembled microwave circuit module and carries out any adjustment that may be found necessary, thus completing the assembling of the microwave circuit module.

Figure 2:
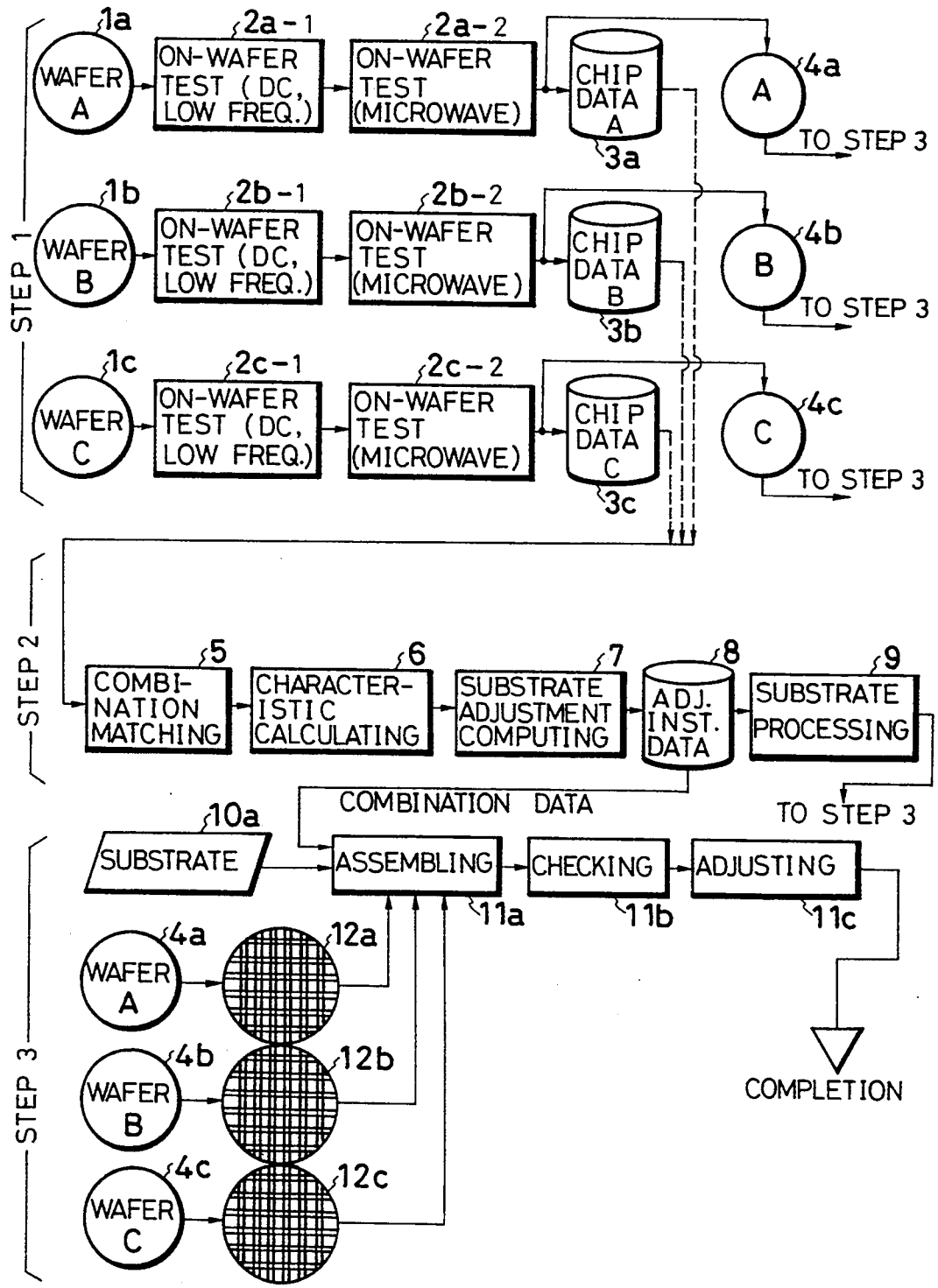
FIG. 2 is a block diagram illustrating a microwave circuit module assembling operation in an embodiment of the invention.

FIG. 2 is a block diagram illustrating a microwave circuit module assembling operation in an embodiment of the invention. The microwave circuit module assembling operation in the embodiment of the invention will be described with reference to FIGS. 1 and 2.

Active elements A, B and C respectively on function element wafers 1a, 1b and 1c are all checked in on-wafer tests 2a-1, 2b-1, and 2c-1 which are conducted in the wafer checking unit 2. The on-wafer tests 2a-1 to 2c-1 are carried out under DC or low frequency range, and checks as to any wiring pattern defect and makes evaluation under low frequency for each of a large number of circuit chips which are provided on a single wafer. In the on-wafer tests 2a-1 to 2c-1, completely defective circuit chips are also discriminated according to the data obtained by the defect checks and the low frequency evaluation of the wiring patterns noted above.

Then, the active elements A to C on the function element wafers 1a to 1c are all checked in on-wafer tests 2a-2, 2b-2 and 2c-2 in the wafer checking unit 2. In these tests 2a-2 to 2c-2, characteristic check, i.e., function check, is done by using a high frequency probe at an actually used high frequency.

The above function check data are stored together with the test results in the on-wafer tests 2a-1 to 2c-1 in corresponding chip data units 3a to 3c and, according to these function check data, the circuit chips with the characteristic thereof exceeding a permissible or tolerable fluctuation range are discriminated.

The chip data units 3a, 3b and 3c store data of circuit chips other than those which are completely defective or the characteristic of which is beyond the permissible fluctuation range. The function element wafers 1a to 1c after the checks in on-wafer tests 2a-1 to 2c-1 and 2a-2 to 2c-2 are stored in the function element wafer storage unit 4. At this time, the function element wafers 4a to 4c are stored in the function element wafer storage unit 4 such that they can be discriminated later.

The above operation is a processing operation to check all the active elements A to C in the on-wafer tests 2a-1 to 2c-1 and 2a-2 to 2c-2 in step 1 shown in FIG. 2.

In the subsequent step 2 shown in FIG. 2, on-wafer test data of the active elements A to C on the function element wafers 1a to 1c, obtained in the step 1, are processed. The on-wafer test data are obtained for each of the active elements A to C and also for each of the circuit chips in each wafer, and there are fluctuations among the circuit chips and among the lots.

Since the plurality of active elements A to C are accommodated in a single microwave circuit module, the combination of circuit chips as noted above is important. The chip combination matching unit 5 finds and matches the optimum combination of such plurality of circuit chips.

A strategy here is to attach the primary importance to the ability of using as many circuit chips as possible without discarding them. Specifically, a strategy is adopted such as to save as many circuit chips as possible even if there are fluctuations from a desired characteristic within the permissible range rather than selecting a few best combinations with the characteristics thereof centered on the desired characteristic.

Thus, the chip combination matching unit 5 (i.e., a combination determining means) determines the optimum combination of a plurality of active elements according to the data in the chip data section 3 so that a desired characteristic or a characteristic closer thereto is obtained as a result of the combining of a plurality of selected and discriminated active elements.

A characteristic calculating unit 6 calculates a predicted characteristic that is obtainable when a plurality of active elements A to C in the combination selected in the chip combination matching unit 5 are combined as a microwave circuit module, and checks if the result of calculation is in the desired standard range.

If the calculated characteristic obtained in the characteristic calculating unit 6 is not in the desired standard range, a substrate adjustment amount computing unit 7 determines through simulation a processing to be applied to a predetermined adjustable portion in the microwave circuit module to obtain a characteristic in the desired standard range. The results calculated are stored in an adjustment processing instruction data unit 8 as an adjustment processing instruction data. The unit 7 calculates the above adjustment processing instruction data for every set of the plurality of active elements A to C in the combination selected in the chip combination matching unit 5.

A substrate adjustment processing unit 9 adjusts the substrate according to the data for each set of the plurality of active elements A to C that are stored in the adjustment processing instruction data unit 8. The adjustment is done by a method based on wire bonding, a method of cutting or removing a strip line pattern portion through evaporation thereof caused by exposure to a laser beam, or a method of bonding a ferroelectric piece.

In step 3 shown in FIG. 2, the set of active elements A to C in the selected combination and corresponding substrate 10a after the adjustment processing, are assembled together, and the system thus obtained is checked. It is suitable to use a specially prepared robot for this step 3.

For obtaining a correct circuit ship combination, a machine can make a more accurate handling than a man can. In addition, as the assembling equipment suited for picking up and assembling circuit chips in a combination selected from a plurality of stored function element wafers 4a to 4c, it is suitable to use a robot as dedicated equipment.

In step 3, divisions 12a to 12c of the respective function element wafers 4a to 4c into circuit chip units are made to permit the circuit chips to be picked up. Subsequently, in an assembling step 11a executed in the assembling/checking unit 11, circuit chips of the active elements A to C to be assembled with the substrate 10a after the adjustment processing are picked up.

In the assembling step 11a, the substrate 10a after the adjustment processing and the picked-up circuit chips are bonded together by die bonding, the wire bonding is added, and then a cover is mounted to seal a circuit chip accommodation section.

After the assembling in the assembling step 11a, a checking step 11b is executed, in which a check is done as to whether the characteristic of the assembled microwave circuit module is in the standard range. Modules with standard characteristic are good products but, for those in which the characteristic thereof is not in the standard range, a next adjustment step 11c may be provided. To carry out such adjustment on a large scale, however, may lead to possible demerits and, therefore, the adjustment in the adjusting step 11c is limited to a small scale.

FIG. 3 and FIGS. 4A to 4C are diagrams for explaining the determination of the combination in the chip combination matching unit 1 shown in FIG. 1. The determination of combination in the chip combination matching unit 5 will now be described with reference to FIG. 3 and FIGS. 4A to 4C.

Figure 3:
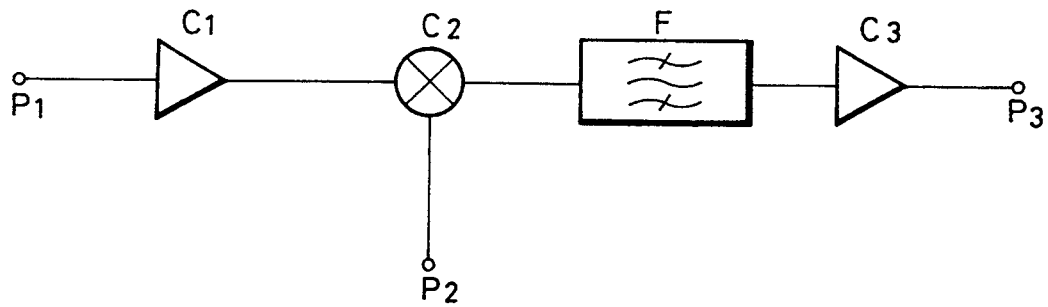
FIG. 3 is a diagram for explaining the determination of a combination made in the chip combination matching unit in FIG. 1.

The algorithm underlying the matching in the chip combination matching unit 5 varies with the functions of the intended microwave circuit module. Here, a frequency converter/amplifier module as shown in FIG. 3 is taken up for explanation. Referring to FIG. 3, designated at C1 is an RF amplifier chip, at C2 a mixer chip, at C3 an IF amplifier chip, at F a filter, at P1 an RF terminal, at P2 an LO terminal, and at P3 an IF terminal.

The transfer function from the RF terminal P1 to the LO terminal P2 is basically the product of multiplication of the characteristics of the RF amplifier chip C1, the mixer chip C2, the filter F and the IF amplifier chip C3. Where the RF and IF amplifier chips C1 and C3 in this circuit fluctuate in two respects, i.e., the gain-frequency characteristic and average gain, a method used is not to take only the best characteristic matching from the combinations of a large number of circuit chips, but to take as many circuit chips as possible as usable ones by saving those which may otherwise be discarded. The method for doing so will now be described.

In this case, it is done by combining the RF and IF amplifier chips C1 and C3 which have opposite characteristics that as many circuit chips as possible may be made usable.

Figure 4A:
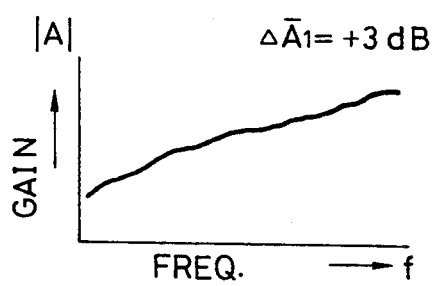
FIGS. 4A–4C are diagrams for explaining also the determination of a combination made in the chip combination matching unit in FIG. 1.
Figure 4B:
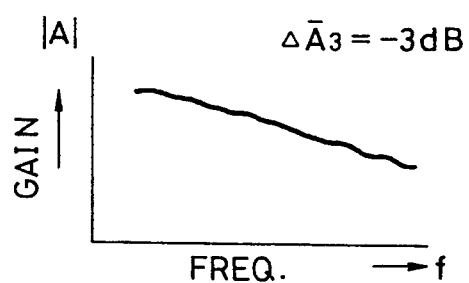
Figure 4C:
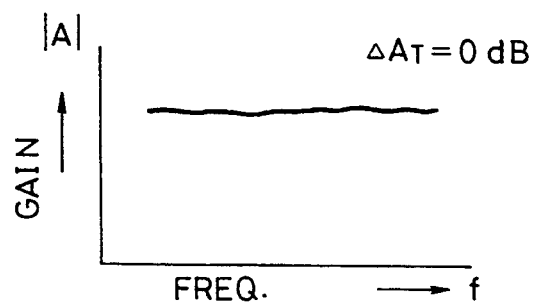

More specifically, by combining, as the RF amplifier chip C1, one the gain of which increases with increase of frequency f (see FIG. 4A) and, as the IF amplifier chip C3, one the gain of which decreases with increase of frequency f (see FIG. 4B), the overall gain-frequency characteristic of the combination approaches a flat characteristic (see FIG. 4C). Likewise, by combining plus (+) and minus (−) gains, the average gain can be brought close to a desired total gain.

For making as many circuit chips as possible to be able to be used saving those to be otherwise discarded, there are various methods. For efficiently carrying out such methods, however, it is necessary to have the data after the on-wafer tests categorized in the step 1. By so doing, it is possible to determine the optimum combination by merely combining together the elements whose data are categorized and arranged in the sequence of trends in the characteristics.

Figure 5A:
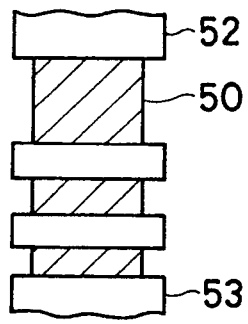
FIGS. 5A–5C are diagrams for explaining examples of ways by which the adjustment is made in a substrate, FIG. 5A showing the stage before the adjustment, FIG. 5B showing the state in which the resistance is increased by the cutting of a resistor pattern with a laser beam, and FIG. 5C showing the state in which the resistance is reduced by wire bonding.
Figure 5B:
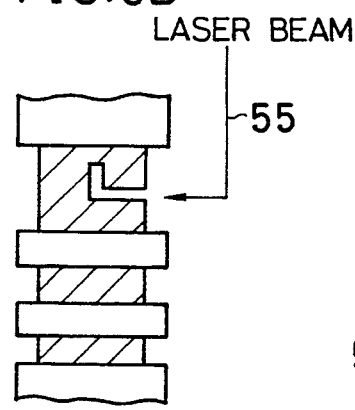
Figure 5C:
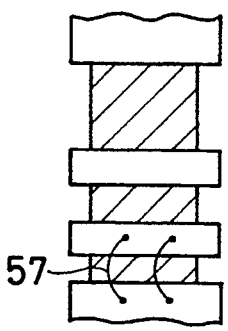

FIGS. 5A to 5C are diagrams showing an example of the result of calculation in the substrate adjustment amount computing unit 7 shown in FIG. 1. FIG. 5A shows the state before the adjustment, FIG. 5B shows the state in which the resistance is increased by the cutting of a resistor pattern 50 between electrode patterns 52 and 53 with a laser beam 55, and FIG. 5C shows the state in which the resistance is reduced by wire bonding 57.

When the RF and IF amplifier chips C1 and C3, for instance, are combined as shown in FIG. 3, there may be a case, in which the frequency characteristic of the IF amplifier chip C3 is so pronounced that the resultant frequency characteristic is not in a desired standard.

In this case, adjustment in a predetermined range is possible if an amplitude equalizer is assembled in the substrate. In this case, the adjustment may be made by changing one or more internal resistance values. The resistance value or values are varied by a method shown in FIG. 5B or 5C.

Figure 6A:
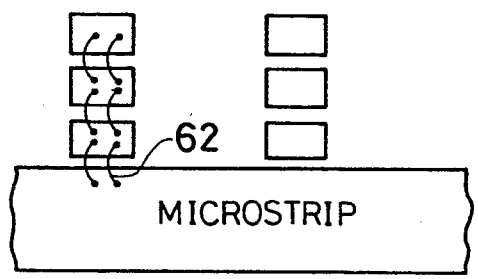
Figure 6B:
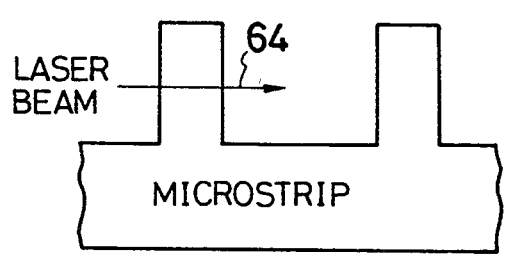
Figure 6C:
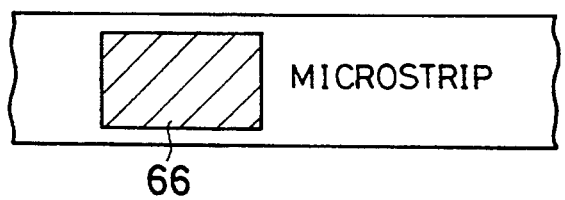

FIGS. 6A to 6C are diagrams showing the substrate adjustment processing executed in the substrate adjustment processing unit 9 shown in FIG. 1, FIG. 8A shows a method of adjustment by wire bonding 62, FIG. 6B shows a method of adjustment by cutting or removing a microstrip line portion by evaporation caused by exposure to a laser beam 64, and FIG. 6C shows a method of adjustment by bonding a ferroelectric piece 66.

Figure 7:
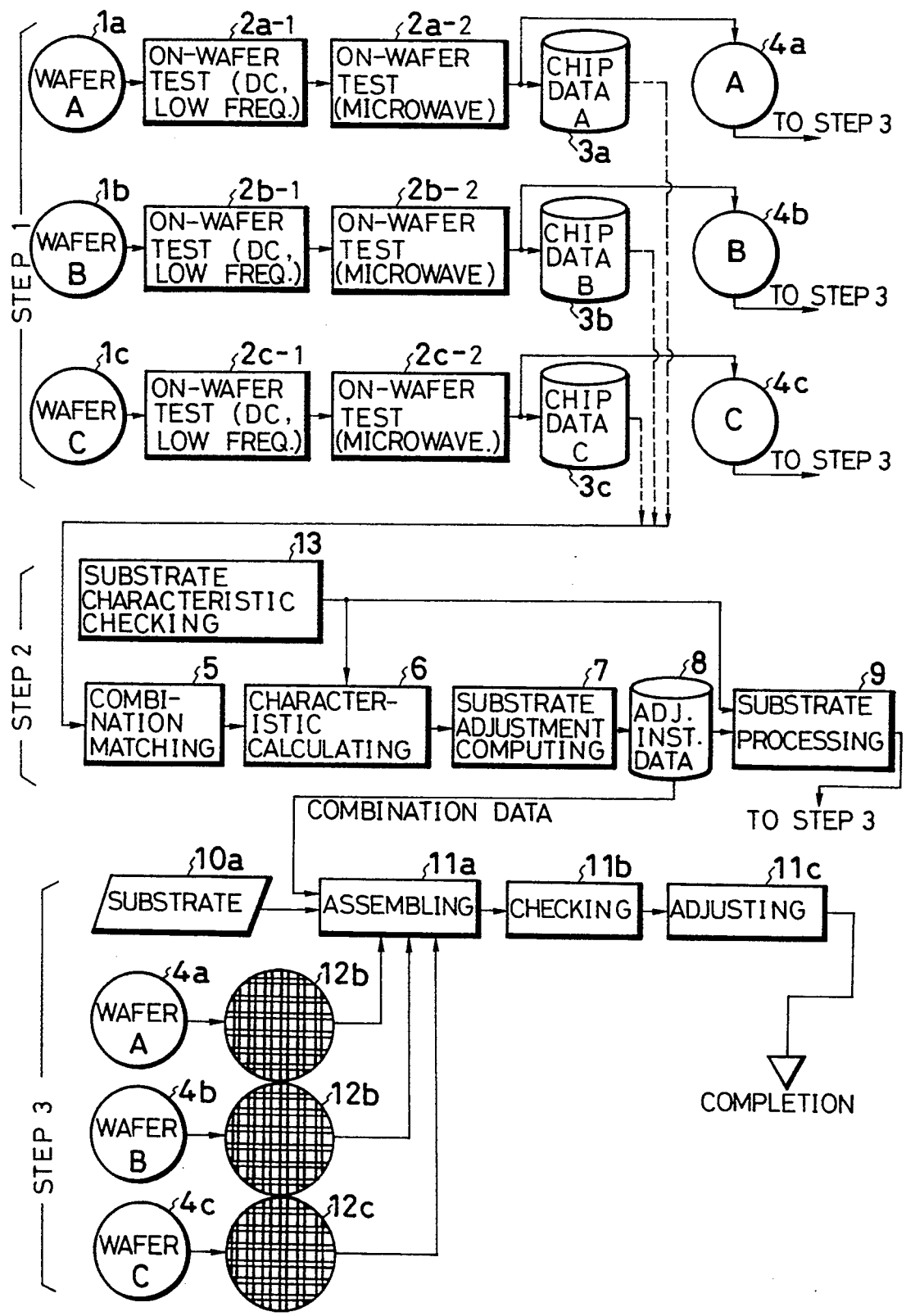
FIG. 7 shows the operation of assembling a microwave circuit module in a different embodiment of the invention.

FIG. 7 shows the operation of assembling a microwave circuit module in a different embodiment of the invention. The embodiment shown therein has the same structure as that of the preceding embodiment of the invention except that a substrate characteristic checking step 13 is provided in the step 2 shown in FIG. 2. Like elements are thus designated by like reference numerals and symbols. Like elements operate in the same way as in the preceding embodiment of the invention.

In the assembling of the microwave circuit module, if there are substrate fluctuations, which are attributable to the manufacture and which are to the extent not to be ignored, these fluctuations must be taken into account when carrying out the adjustment processing.

More specifically, the characteristic of the substrate, on which the circuit chips in the combination determined by the chip combination matching unit 5 are to be mounted, is measured in the substrate characteristic checking step 13, and measurement data thus obtained is supplied to the characteristic calculating unit 6.

According to the characteristics of the circuit chips in the combination determined by the chip combination matching unit 5 and the measurement data obtained in the substrate characteristic checking step 13, the characteristic calculating unit 6 calculates the predicted characteristic, which is expected from combining, as microwave circuit module, these circuit chips and the substrate. The unit 6 then checks whether the result of calculation is in a desired standard range.

If the calculated characteristic obtained in the characteristic calculating unit 6 is not in the desired standard range, the substrate adjustment amount computing unit 7 determines, through simulation, a processing to be applied to a predetermined adjustable in the microwave circuit module substrate for obtaining a characteristic in a desired standard range. The result of the simulation is stored as adjustment processing instruction data in the adjustment processing instruction data unit 8. The substrate adjustment amount computing unit 7 calculates the adjustment processing instruction data for each set of a plurality of active elements A to C in the combination selected in the chip combination matching circuit 5 and a substrate corresponding thereto.

The substrate adjustment processing unit 9 adjusts the substrate, the characteristic of which has been measured in the substrate characteristic checking step 13, according to the data of the set of the plurality of active elements A to C stored in the adjustment processing instruction data unit 8 and the corresponding substrate data. In this way, adjustment of the substrate can be done in correspondence to the substrate fluctuations in manufacture.

Figure 8:
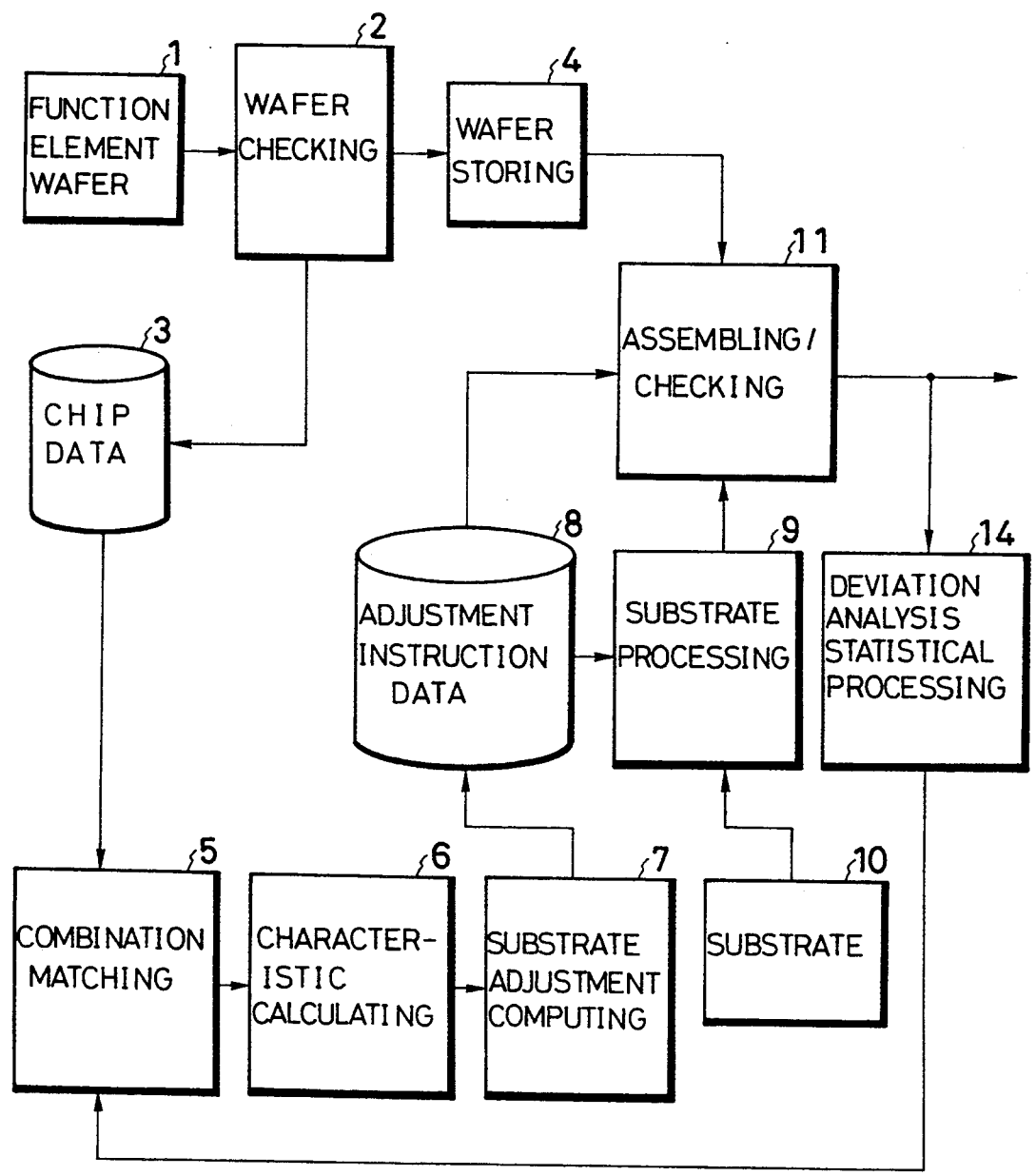
FIG. 8 is a block diagram showing a general structural arrangement of another embodiment of the invention.

FIG. 8 is a block diagram showing a different embodiment of the structure according to the invention.

This embodiment has the same structure as that of the previous embodiment of the invention shown in FIG. 1 except that in this embodiment a deviation analysis statistical processing unit 14 is provided, which statistically processes the result of checking in the assembling/checking unit 11 and feeds back the result of the processing to the chip combination matching unit 5. Like elements are designated by like reference numerals and symbols. Also, like elements operate in the same way as in the previous embodiment of the invention.

The deviation analysis statistical processing unit 14 statistically processes the characteristic of the microwave circuit module as obtained in the assembling/checking unit 11 for analyzing a deviation with respect to the predicted value. The unit 14 feeds back the result of processing to the processing in the chip combination matching unit 5 and following units.

It is thus possible to add minute modifications to the substrate adjustment amount calculation process and thus increase the overall microwave circuit module yield. It is possible to provide a dedicated processing unit for the correction of the substrate according to the result of analysis in the deviation analysis statistical processing unit 14.

Figure 9:
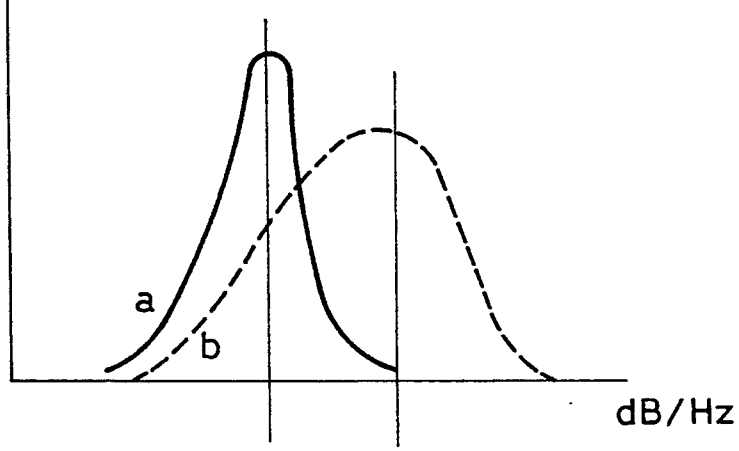
FIG. 9 is a graph showing an example of the result of an analysis made at the deviation analysis statistical processing unit shown in FIG. 8.
Figure 10:
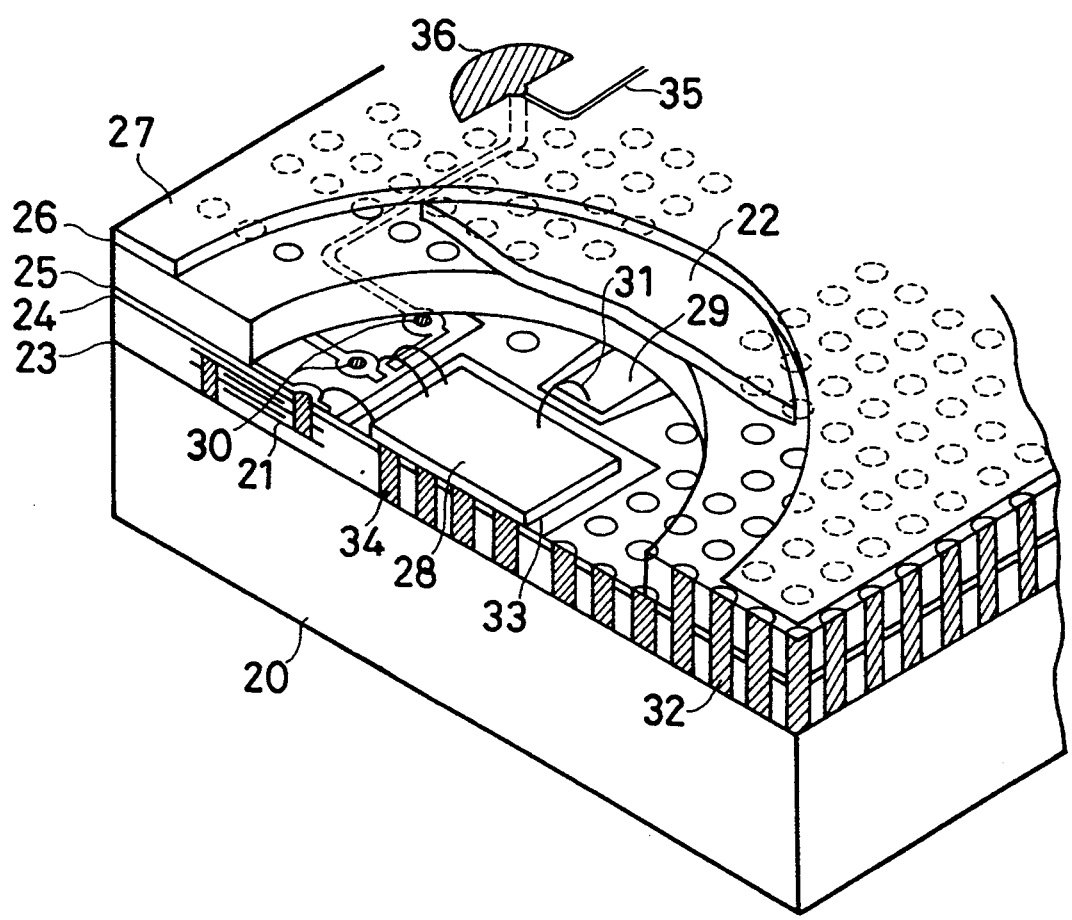
FIG. 10 is a perspective view of a composite microwave circuit module as a prior proposal (not prior art but related art).

Now, a case will be considered, which is based on the assumption of adjusting the gain-frequency characteristic with an amplitude equalizer assembled in the substrate. It is assumed that a distribution shown by solid curve "a" in FIG. 9, which is the predicted characteristic, is deviated by the actual distribution as shown by dashed curve "b".

It is further assumed that in this case the distribution of the dashed curve "b" has an increased spread due to various fluctuation factors other than those introduced into the calculation and also that the center of the distribution is deviated from the predicted one. It is impossible to reduce the spread of the distribution of this dashed line "b", but it is possible to bring the center of the distribution to the predicted one.

In this situation, since the operator has due knowledge of the contents of the characteristic calculation and effects of the adjustment operation, the processing in the chip combination matching unit 5 and following units may be carried out in such a manner as to compensate for the above deviation. For example, if the calculated compensation amount is excessive, the amount of processing on the substrate may be reduced.

As shown above, according to characteristic data of the active elements A to C, obtained by actual measurement in the on-wafer tests 2a-1 to 2c-1 and 2a-2 to 2c-2, a circuit chip combination which permits the maximum overall yield to be obtained, is determined in the chip combination matching unit 5, the characteristic prediction is made in the characteristic calculating unit 6 for every circuit chip combination, and if the result of prediction is out of the desired standard range, adjustment processing on the substrate 10 is made in the substrate adjustment processing unit 9 according to the amount of adjustment determined in the substrate adjustment amount computing unit 7. Thus, microwave circuit module production with a high overall yield is made possible.

Further, since adjustment of the microwave circuit module after manufacture by highly skilled personnel is not required, it is possible to obtain a highly reliable microwave circuit module at a low cost.

Further, while the above description has been made in conjunction with the frequency converter/amplifier module as shown in FIG. 3, it is obvious that this is by no means limitative, and the invention is applicable to other microwave circuit modules as well.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. An apparatus for manufacturing a microwave circuit module having a plurality of active elements mounted on a substrate, said apparatus comprising:
   a memory means which stores results of checks of characteristics of the active elements immediately after the manufacture with said results being stored individually in correspondence to said active elements;
   a combination determining means which determines a combination among said active elements such that a characteristic value to be derived from said combination among said active elements based on said results in the memory means is in a predetermined range;
   a calculating means which calculates a combined predicted characteristic value of said combination based on said results in the memory means on each of those active elements which are determined by said combination determining means;
   a computing means which, when said combined predicted characteristic value obtained at said calculating means is outside said predetermined range, computes a content and an amount of adjustment to be made in said substrate for said combined predicted characteristic value to be in said predetermined range;
   a substrate processing means which processes said substrate based on results of computation in said computing means; and
   an assembling means which assembles the active elements in said combination determined by said combination determining means on the substrate having been processed in said substrate processing means.

2. The apparatus for manufacturing a microwave circuit module according to claim 1, further comprising a characteristic checking means associated to said calculating means, for detecting a predicted module characteristic value obtainable when the active elements in said combination are assembled on said substrate based on a preliminarily detected characteristic value of said substrate and the results of checks of characteristics of said active elements in said combination determined by said determining means.

3. The apparatus for manufacturing a microwave circuit module according to claim 2, further comprising a checking means for checking a module characteristic value of the microwave circuit module assembled in said assembling means, and an analyzing means for analyzing a deviation of said module characteristic value from said predicted module characteristic value of said microwave circuit module, the results of the analysis being fed-back to said combination determining means.

4. A method for manufacturing a microwave circuit module having a plurality of active elements mounted on a substrate, said method comprising the steps of:
   checking characteristics of all active elements immediately after their manufacture;
   storing, in a memory, results of checks of the characteristics of the active elements with said results being stored individually in correspondence to said active elements;
   determining a combination among said active elements according to said results of checks in the memory such that a characteristic value of the combination among said active elements results in a predetermined range;
   calculating a combined predicted characteristic value of said combination according to said results of checks of the characteristics of the active elements determined;
   computing, when said combined predicted characteristic value obtained in said calculating step is outside said predetermined range, a content and an amount of adjustment to be made in said substrate for said combined predicted characteristic value to be in said predetermined range;
   processing a substrate according to results obtained in said computing step; and
   assembling the active elements in said determined combination on said substrate having been processed.

5. The method for manufacturing a microwave circuit module according to claim 4, further comprising a step of detecting a predicted module characteristic value obtainable when the active elements in said combination are assembled on said substrate based on a preliminarily detected characteristic value of said substrate and said results of the characteristics of said active elements stored.

6. The method for manufacturing a microwave circuit module according to claim 8, further comprising the steps of:
   checking a module characteristic value of the microwave circuit module assembled in said assembling step;
   analyzing a deviation of said module characteristic value from said predicted module characteristic value of said microwave circuit module obtained in said detecting step; and
   feeding back results of the analysis of the deviation to the step of determining the combination among the active elements.

* * * * *

UNITED STATES PATENT AND TRADEMARK OFFICE
CERTIFICATE OF CORRECTION

PATENT NO. : 5,396,433
DATED : March 7, 1995
INVENTOR(S) : Yuhei Kosugi

It is certified that error appears in the above-indentified patent and that said Letters Patent is hereby corrected as shown below:

Column 1, line 49, delete "thorough-holes 32 and 84" and insert --through-holes 32 and 34--.

Column 4, line 67, delete "8A-8C" and insert --6A-6C--.

Column 5, line 42, delete "8" and insert --6--.

Signed and Sealed this

Twenty-second Day of August, 1995

Attest:

BRUCE LEHMAN

Attesting Officer

Commissioner of Patents and Trademarks